US010130006B2

(12) United States Patent
Papoulis et al.

(10) Patent No.: US 10,130,006 B2
(45) Date of Patent: Nov. 13, 2018

(54) THERMAL CONTROL WITHIN AN ENCLOSURE WITH CIRCULAR CROSS-SECTION

(71) Applicant: Hanon Systems, Daejeon (KR)

(72) Inventors: Evangelos Papoulis, Northville, MI (US); James Tasiopoulos, Saint Clair Shores, MI (US); Ken Belford, Pinckney, MI (US)

(73) Assignee: HANON SYSTEMS, Daejeon (KR)

(*) Notice: Subject to any disclaimer, the term of this patent is extended or adjusted under 35 U.S.C. 154(b) by 34 days.

(21) Appl. No.: 15/209,888

(22) Filed: Jul. 14, 2016

(65) Prior Publication Data

US 2017/0311476 A1    Oct. 26, 2017

Related U.S. Application Data

(60) Provisional application No. 62/325,660, filed on Apr. 21, 2016.

(51) Int. Cl.
| | |
|---|---|
| *H05K 7/20* | (2006.01) |
| *F28D 1/047* | (2006.01) |
| *F28F 9/22* | (2006.01) |
| *F28D 1/053* | (2006.01) |
| *F28D 21/00* | (2006.01) |
| *F28D 1/02* | (2006.01) |

(52) U.S. Cl.
CPC ............ *H05K 7/202* (2013.01); *F28D 1/024* (2013.01); *F28D 1/0471* (2013.01); *F28D 1/0476* (2013.01); *F28D 1/05366* (2013.01); *F28D 21/00* (2013.01); *F28F 9/22* (2013.01); *H05K 7/20145* (2013.01); *F28F 2250/08* (2013.01); *H05K 7/20136* (2013.01); *H05K 7/20172* (2013.01); *H05K 7/20218* (2013.01)

(58) Field of Classification Search
CPC .......... H05K 7/20136; H05K 7/20145; H05K 7/20172; H05K 7/202; H05K 7/20218; G06F 1/20
USPC ................... 361/695–697; 454/184
See application file for complete search history.

(56) References Cited

U.S. PATENT DOCUMENTS

| 4,106,693 A * | 8/1978 | Oliver ................... F24B 1/1886 126/502 |
| 4,603,680 A * | 8/1986 | Dempsey ................. F23J 13/04 126/109 |

(Continued)

FOREIGN PATENT DOCUMENTS

| JP | S54154855 A | 12/1979 |
| JP | S597866 A | 1/1984 |

(Continued)

*Primary Examiner* — Zachary Pape
(74) *Attorney, Agent, or Firm* — Shumaker, Loop & Kendrick, LLP; James D. Miller

(57) ABSTRACT

A thermal control system includes an enclosure configured to contain a thermal mass. A baffle plate is disposed in the enclosure. A heat exchanger is coextensive with and cooperates with the baffle plate to divide the enclosure into a first chamber and a second chamber. An air circulation element cooperates with the baffle plate and the heat exchanger to define an air circulation path and to cause air to flow through the air circulation path. The heat exchanger exchanges thermal energy with the air flowing through the air circulation path.

18 Claims, 2 Drawing Sheets

(56) References Cited

U.S. PATENT DOCUMENTS

| | | | | |
|---|---|---|---|---|
| 4,624,301 A | * | 11/1986 | Baggott | F24C 15/322 165/122 |
| 4,807,588 A | * | 2/1989 | Bentley | F24H 3/105 126/110 R |
| 4,974,579 A | * | 12/1990 | Shellenberger | F24H 3/087 126/110 R |
| 5,097,819 A | * | 3/1992 | Talbert | F24H 8/00 126/110 R |
| 5,437,263 A | * | 8/1995 | Ellingham | F24H 3/105 126/110 AA |
| 6,367,410 B1 | * | 4/2002 | Leahey | H01L 21/67103 118/58 |
| 6,474,328 B1 | * | 11/2002 | Fells | F24H 3/087 126/110 R |
| 7,044,849 B2 | * | 5/2006 | Dippel | B60H 1/3407 454/143 |
| 7,393,206 B2 | * | 7/2008 | Lin | F27B 17/00 126/99 A |
| 7,438,132 B2 | * | 10/2008 | Cook | E21B 7/208 166/207 |
| 8,526,182 B2 | * | 9/2013 | Chen | H05K 7/20736 165/104.33 |
| 2015/0260459 A1 | | 9/2015 | Cameron | |
| 2015/0323229 A1 | | 11/2015 | Kim et al. | |
| 2016/0134175 A1 | * | 5/2016 | Halme | F28D 7/0008 165/173 |

FOREIGN PATENT DOCUMENTS

| | | |
|---|---|---|
| JP | 60032666 U1 | 3/1985 |
| JP | H0783586 A | 3/1995 |
| JP | 08028979 | 2/1996 |
| JP | 2004006744 A | 1/2004 |
| JP | 2006507676 A | 3/2006 |
| JP | 2015-007503 A | 1/2015 |
| KR | 20130016321 A | 2/2013 |

* cited by examiner

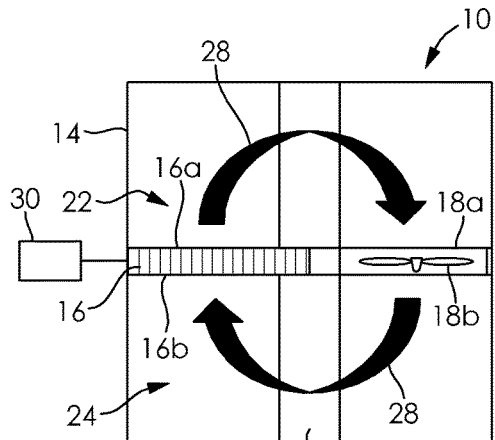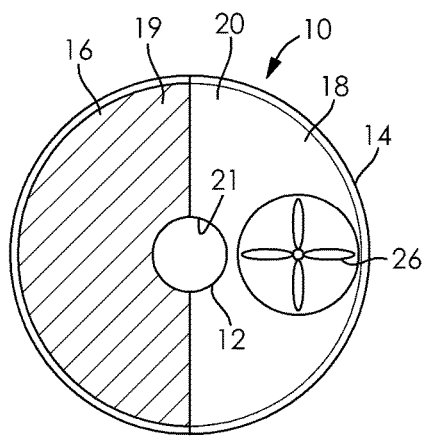
FIG. 1A　　　FIG. 1B
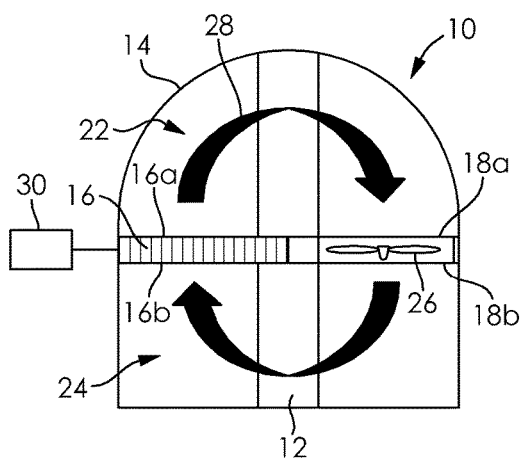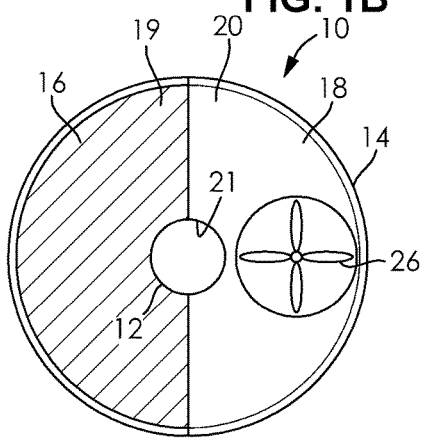
FIG. 2A　　　FIG. 2B
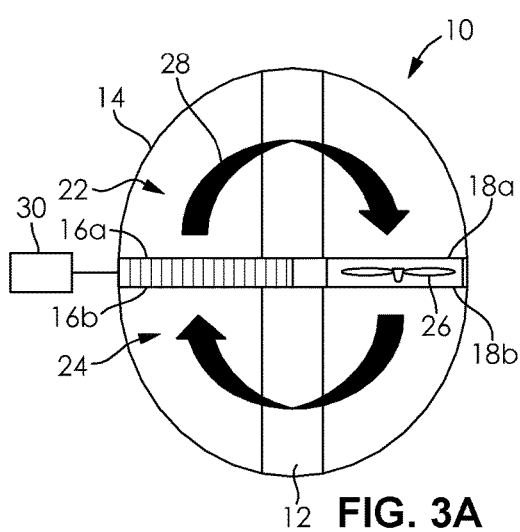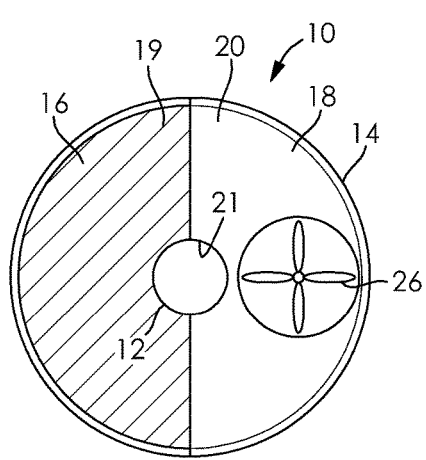
FIG. 3A　　　FIG. 3B

THERMAL CONTROL WITHIN AN ENCLOSURE WITH CIRCULAR CROSS-SECTION

CROSS-REFERENCE TO RELATED APPLICATIONS

This application claims the benefit of U.S. Provisional Application No. 62/325,660, filed on Apr. 21, 2016. The entire disclosure of the above application is hereby incorporated herein by reference.

FIELD OF THE INVENTION

The present invention relates to heating and cooling a thermal mass within a sealed enclosure, and more particularly to heating and cooling a thermal mass within a sealed enclosure having a circular cross-section.

BACKGROUND OF THE INVENTION

In many applications, it may be required to hermetically seal an enclosure to prevent accumulation of moisture, contamination, damage, leakage, or other undesired effects to thermal masses such as mechanical components, electrical components, and fluid components, for example, contained within the enclosure. The thermal masses within the enclosure may need to be heated or cooled depending on the application. Specifically, it may be desired to provide heating and cooling within sealed enclosures with circular cross-sections. However, it is often difficult to provide heating and cooling to the thermal masses within the sealed enclosure without causing undesired effects to the thermal masses or to the enclosures. For example, certain materials and fluids may not be appropriate for use for cooling and heating within the enclosure due to the sensitivity of the thermal masses. Therefore, there is a continuous need to provide thermal control systems for sealed enclosures that efficiently and uniformly control heating and cooling within the enclosures.

Accordingly, it would be desirable to provide a thermal control system for an enclosure having a circular cross-section that minimizes undesired effects to the enclosure or thermal masses contained within the enclosure and optimizes heating and cooling of the thermal masses.

SUMMARY OF THE INVENTION

In accordance and attuned with the present invention, a thermal control system for an enclosure having a circular cross-section that minimizes undesired effects to the enclosure or thermal masses contained within the enclosure and optimizes heating and cooling of the thermal masses has surprisingly been discovered.

According to an embodiment of the disclosure, a thermal control system includes an enclosure configured to contain a thermal mass. A baffle plate is disposed in the enclosure. A heat exchanger is disposed in the enclosure and cooperates with the baffle plate to divide the enclosure into a first chamber and a second chamber. An air circulation element cooperates with the baffle plate and the heat exchanger to define an air circulation path and to cause air to flow through the air circulation path. The heat exchanger exchanges thermal energy with the air flowing through the air circulation path.

According to another embodiment of the disclosure, a thermal control system is disclosed. The thermal control system includes a thermal mass and an enclosure containing the thermal mass. The enclosure has a circular cross-sectional shape. A baffle plate is disposed in the enclosure. The baffle plate has a curvature substantially equal to a curvature of the enclosure. A heat exchanger is disposed in the enclosure and cooperates with the baffle plate to divide the enclosure into a first chamber and a second chamber. The heat exchanger has a curvature substantially equal to the curvature of the enclosure. An air circulation element cooperates with the baffle plate and the heat exchanger to define an air circulation path and cause air to flow through the air circulation path. The heat exchanger exchanges thermal energy with the air flowing through the air circulation path.

According to a further embodiment of the disclosure, a thermal control system includes a thermal mass. An enclosure contains the thermal mass. A baffle plate is disposed in the enclosure. A heat exchanger is disposed in the enclosure and cooperates with the baffle plate to divide the enclosure into a first chamber and a second chamber. The heat exchanger includes a plurality of arcuate concentrically aligned tubes and a plurality of fins interposed between the plurality of tubes. An air circulation element cooperates with the baffle plate and the heat exchanger to define an air circulation path and cause air to flow through the air circulation path. The heat exchanger exchanges thermal energy with the air flowing through the air circulation path.

BRIEF DESCRIPTION OF THE DRAWINGS

The above advantages of the invention will become readily apparent to those skilled in the art from reading the following detailed description of an embodiment of the invention in the light of the accompanying drawings, in which:

FIG. 1A is a schematic cross-sectional side elevational view of a thermal control system according to an embodiment of the disclosure;

FIG. 1B is a schematic cross-sectional top plan view of the thermal control system of FIG. 1A;

FIG. 2A is a schematic cross-sectional side elevational view according to another embodiment of the disclosure;

FIG. 2B is a schematic cross-sectional top plan view of the thermal control system of FIG. 2A;

FIG. 3A is a schematic cross-sectional side elevational view according to another embodiment of the disclosure;

FIG. 3B is a schematic cross-sectional top plan view of the thermal control system of FIG. 3A.

DETAILED DESCRIPTION OF THE PREFERRED EMBODIMENT

Figure 4:
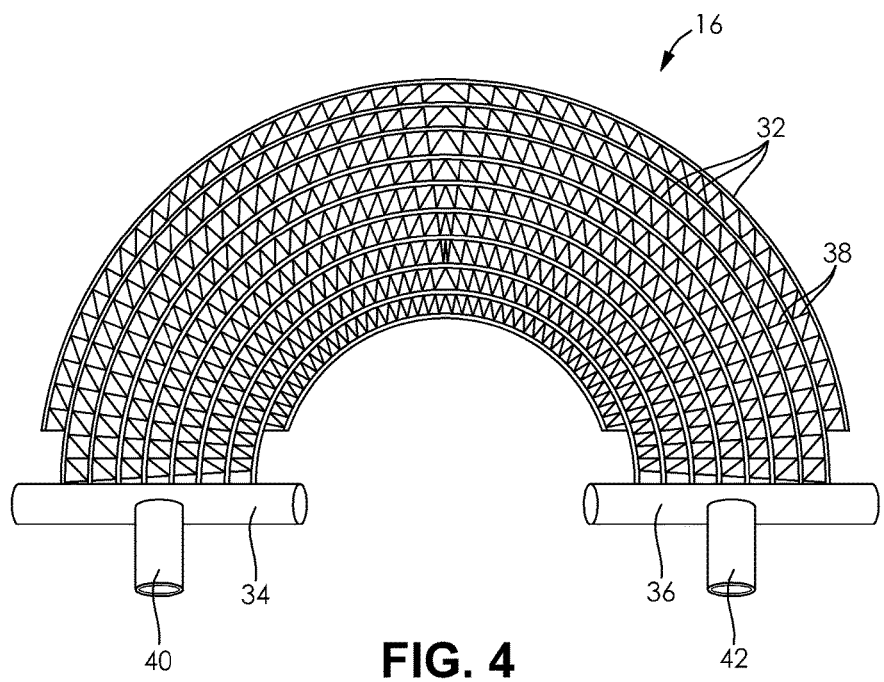
FIG. 4 is a top perspective view of a heat exchanger of a thermal control systems of according to an embodiment of the disclosure.

The following detailed description and appended drawings describe and illustrate various exemplary embodiments of the invention. The description and drawings serve to enable one skilled in the art to make and use the invention, and are not intended to limit the scope of the invention in any manner.

FIGS. 1A and 1B illustrate a thermal control system 10 for heating and cooling a thermal mass 12. The thermal mass 12 can be any solid, liquid, or semi-liquid object or material requiring heating or cooling thereof. For example, the thermal mass 12 can be mechanical components or electrical components prone to deterioration or damage from the environment.

The thermal control system 10 includes a substantially sealed enclosure 14 to contain the thermal mass 12 therein and militate against deterioration or damage to the thermal mass 12 resulting from external elements or conditions. The sealed enclosure 14 represents any sealed structure such as a sealed casing, tank, housing, container, compartment, and building structure, for example, wherein avoidance of moisture and environmental effects are desired.

In the embodiments shown, the enclosure 14 has a substantially circular cross-sectional shape. shape. For example, in FIGS. 1A and 1B the enclosure 14 has a substantially cylindrical shape with a substantially circular cross-sectional shape. In another example, as shown in FIGS. 2A and 2B, the enclosure 14 can have a shape that is substantially cylindrical at one end thereof and substantially hemispherical at a second end thereof with a substantially circular cross-sectional shape. In yet another example, as shown in FIGS. 3A and 3B, the enclosure 14 can have a substantially spherical shape with a substantially circular cross-sectional shape. However, it is understood the enclosure 14 can have any shape having a substantially circular cross-sectional shape without departing from the scope of the disclosure. For example, the enclosure 14 can be substantially ellipsoidal or substantially frusto-conical, for example. The term "substantially" used in conjunction with the above-mentioned shapes means at least mostly, but not perfectly, one of the above-mentioned shapes.

In FIGS. 1A-3B, a heat exchanger 16 and a baffle plate 18 or a thin and planar sheet of material are disposed within the enclosure 14 substantially parallel to a plane transverse to an axial direction of the enclosure 14. FIGS. 1A-3B are schematic illustrations, the cross-sectional views are schematic illustrations of the heat exchanger 16 and the baffle plate 18 to illustrate relationship with each other and the enclosure 12. Each of the heat exchanger 16 and the baffle plate 18 extend radially inwardly from adjacent an inner surface of a peripheral wall of the enclosure 14. The heat exchanger 16 and the baffle plate 18 together are configured to define an area substantially equal to or approximate to an area of a cross-section of the enclosure 14 taken along a plane parallel to a plane extending through the heat exchanger 16 and baffle plate 18 and transverse to the axial direction of the enclosure 14. In certain embodiments, the heat exchanger 16 and the baffle plate 18 are coupled to the enclosure 14 by any type of commonly known coupling means, brackets, welding processes, or the like. However, in other embodiments the heat exchanger 16 and the baffle plate 18 can be integrally formed with the enclosure 14.

The heat exchanger 16 is disposed in a first cross-sectional portion 19 of the enclosure 14 and the baffle plate 18 is disposed in a second cross-sectional portion 20 of the enclosure 14. The heat exchanger 16 and the baffle plate 18 cooperate to divide the enclosure 14 into a first chamber 22 and a second chamber 24 in the axial direction of the enclosure 14. The first chamber 22 is spaced from the second chamber 24 with respect to the axial direction of the enclosure 14. The first chamber 22 is generally defined by the enclosure 14, a first surface 16a of the heat exchanger 16, and a first surface 18a of the baffle plate 18. The second chamber 24 is generally defined by the enclosure 14, a second surface 16b of the heat exchanger 16, and a second surface 18b of the baffle plate 18. In the embodiments illustrated, the heat exchanger 16 is coextensive with and aligns with the baffle plate 18 with respect to a transverse direction of the enclosure 14. However, the heat exchanger 16 can be spaced from the baffle plate 18 with respect to a longitudinal direction of the enclosure 14, if desired, to define the first chamber 22 and the second chamber 24. Receiving features 21 such as openings and/or recesses, can be formed in or through the heat exchanger 16 and/or the baffle plate 18 to receive and accommodate the thermal mass 12. In such a scenario, the receiving features 21 are configured to correspond in shape to a shape of an outer surface of the thermal mass 12.

An air circulation element 26 is disposed in the baffle plate 18 at the interface of the first chamber 22 and the second chamber 24 and provides fluid communication between the first chamber 22 and the second chamber 24. The air circulation element 26 directs air within the enclosure 14 to flow along an air circulation path 28. The air circulation path 28 extends in order through the second chamber 24 from the air circulation element 26 to an air inlet of the heat exchanger 16, through the heat exchanger 16, and through the first chamber 22 from an outlet of the heat exchanger 16 to the air circulation element 26. Only one air circulation element 26 is illustrated. However, it is understood more than one air circulation element 26 can be included to control the air flowing through the enclosure 14 depending on the application. As shown, the air circulation element 26 is a fan. However, the air circulation element 26 can be a plurality of fans or other elements configured to cause the air to flow through the chambers 22, 24 of the enclosure 14.

The second chamber 24 downstream of the air circulation element 26 is a high pressure chamber or receives the air at a higher pressure than the first chamber 22. Reversely, the first chamber 22 upstream of the air circulation element 26 is a low pressure chamber or receives the air at a lower pressure than the second chamber 24. The air circulation element 26 facilitates circulating the air flowing through the enclosure 14 from the high pressure second chamber 24 to the low pressure first chamber 22 and back again.

The baffle plate 18 has a curvature corresponding to a curvature of the inner surface of the periphery of the enclosure 14. The baffle plate 18 has a substantially semi-circular cross-sectional shape. However, the baffle plate 18 can have any cross-sectional shape as desired. As illustrated, the baffle plate 18 has an aperture formed therein for receiving the air circulation element 26.

The baffle plate 18 can include airflow features or elements configured to redirect the air flowing through the enclosure 14 and/or increase the air pressure within the high pressure second chamber 24 to facilitate flow of air uniformity through the heat exchanger 16 and the enclosure 14. For example, the airflow features can include temperature control doors, valves, vents, louvres, auxiliary air circulation elements, surface features, or any other mechanical means, electrical means, or structural means, as desired to control a velocity, a flow direction, a turbulence, a temperature, a pressure, or other characteristics of the air flowing through the enclosure 14.

The heat exchanger 16 has a curvature corresponding to a curvature of the inner surface of the periphery of the enclosure 14. For example, the heat exchanger 16 has a substantially semi-circular cross-sectional shape. However, the heat exchanger 16 can have any cross-sectional shape as desired. The heat exchanger 16 shown is a fluid-to-air type heat exchanger configured to provide heat transfer between a fluid flowing therethrough and the air flowing through the enclosure 14 along the air circulation path 28. The fluid such as a coolant, for example, is provided to the heat exchanger 16 by an exterior fluid source 30. In one embodiment, the heat exchanger 16 has a curved cross-flow design with a curvature normal to a direction of the flow of air therethrough. Such a configuration maximizes a thermal capacity of the heat exchanger 16. The heat exchanger 16 has a first cross-sectional area and the baffle plate 18 has a second cross-sectional area. In the embodiment shown, the first cross-sectional area and the second cross-sectional area are substantially equal to a cross-sectional area of the enclosure 14.

FIG. 4 illustrates an example of the heat exchanger 16 of the thermal control system 10 schematically shown in FIGS. 1A-3B. The heat exchanger 16 includes a plurality of concentrically aligned arcuate tubes 32 extending between an inlet reservoir 34 and an outlet reservoir 36. A plurality of fins 38 is interposed between the tubes 32 to facilitate heat transfer between the air flowing through the enclosure 14 and the fluid flowing through the heat exchanger 16. The tubes 32 convey the fluid therethrough from the inlet reservoir 34 to the outlet reservoir 36. The inlet reservoir 34 includes an inlet port 40 and the outlet reservoir 36 includes an outlet port 42. The inlet port 40 receives the fluid from the fluid source 30 and the outlet port 42 returns the fluid to the fluid source 30. The heat exchanger 16 has a cross-sectional area corresponding to a sector of a circular cross-sectional area of the enclosure 14.

In application, the heat exchanger 16 and the baffle plate 18 cooperate to divide the enclosure 14 into the first chamber 22 and the second chamber 24. The circulation element 26 circulates the air through the enclosure 14 along the air circulation path 28. The heat exchanger 16 is used to condition the air by transferring heat between the air and the fluid flowing therethrough. The conditioned air either heats or cools the thermal mass 12 disposed within the enclosure 14. If it is desired to cool the thermal mass 12, the heat exchanger 16 transfers heat from the air to the liquid flowing therethrough to cool the air. Consequently, as the air flows through the enclosure 14 and past the thermal mass 12, heat is transferred from the thermal mass 12 to the air to cool the thermal mass 12. Conversely, if it is desired to heat the thermal mass 12, the heat exchanger 16 transfers heat from the fluid flowing therethrough to heat the air. Consequently, as the air flows through the enclosure 14 and past the thermal mass 12, heat is transferred from the air to the thermal mass 12.

Advantageously, the thermal control system 10 permits a thermal mass 12 to be contained within the sealed enclosure 14 while controlling a desired heating and cooling of the thermal mass 12 and/or the enclosure 14. In certain scenarios, condensation formed on or within the enclosure 14 can be minimized and a longevity of the thermal mass 12 can be maximized.

From the foregoing description, one ordinarily skilled in the art can easily ascertain the essential characteristics of this invention and, without departing from the spirit and scope thereof, can make various changes and modifications to the invention to adapt it to various usages and conditions.

What is claimed is:

1. A thermal control system comprising:
   an enclosure configured to contain a thermal mass;
   a baffle plate disposed in the enclosure;
   a heat exchanger disposed in the enclosure and cooperating with the baffle plate to divide the enclosure into a first chamber and a second chamber; and
   an air circulation element cooperating with the baffle plate and the heat exchanger to define an air circulation path and cause air to flow through the air circulation path, the heat exchanger exchanging thermal energy with the air flowing through the air circulation path, wherein the air circulation element is disposed in the baffle plate, wherein the enclosure has a circular cross-sectional shape, and wherein the heat exchanger has a curvature corresponding to a curvature of an inner surface of a periphery of the enclosure.

2. The thermal control system of claim 1, wherein the heat exchanger receives a coolant therein.

3. The thermal control system of claim 1, wherein the air circulation element is disposed at an interface between the first chamber and the second chamber.

4. The thermal control system of claim 1, wherein the air circulation path extends in order through the second chamber from the air circulation element to an inlet of the heat exchanger, through the heat exchanger, and through the first chamber from an outlet of the heat exchanger to the air circulation element.

5. The thermal control system of claim 1, wherein the air circulation element is a fan.

6. The thermal control system of claim 1, wherein the air circulation element is a plurality of fans.

7. The thermal control system of claim 1, wherein the heat exchanger aligns with the baffle plate with respect to a transverse direction of the enclosure.

8. The thermal control system of claim 1, wherein at least one of the heat exchanger and the baffle plate includes a receiving feature configured to receive the thermal mass.

9. The thermal control system of claim 1, wherein the heat exchanger has a first cross-sectional area and the baffle plate has a second cross-sectional area, the first cross-sectional area and the second cross-sectional area substantially equal to a cross-sectional area of the enclosure.

10. A thermal control system comprising:
    an enclosure configured to contain a thermal mass;
    a baffle plate disposed in the enclosure;
    a heat exchanger disposed in the enclosure and cooperating with the baffle plate to divide the enclosure into a first chamber and a second chamber; and
    an air circulation element cooperating with the baffle plate and the heat exchanger to define an air circulation path and cause air to flow through the air circulation path, the heat exchanger exchanging thermal energy with the air flowing through the air circulation path, wherein the air circulation element is disposed in the baffle plate, wherein the enclosure has a circular cross-sectional shape, and wherein the baffle plate has a curvature corresponding to a curvature of an inner surface of a periphery of the enclosure.

11. A thermal control system comprising:
    an enclosure configured to contain a thermal mass;
    a baffle plate disposed in the enclosure;
    a heat exchanger disposed in the enclosure and cooperating with the baffle plate to divide the enclosure into a first chamber and a second chamber; and
    an air circulation element cooperating with the baffle plate and the heat exchanger to define an air circulation path and cause air to flow through the air circulation path, the heat exchanger exchanging thermal energy with the air flowing through the air circulation path, wherein the air circulation element is disposed in the baffle plate, and wherein the heat exchanger has a plurality of concentrically aligned tubes.

12. A thermal control system comprising:
    an enclosure configured to contain a thermal mass;
    a baffle plate disposed in the enclosure;
    a heat exchanger disposed in the enclosure and cooperating with the baffle plate to divide the enclosure into a first chamber and a second chamber; and an air circulation element cooperating with the baffle plate and the heat exchanger to define an air circulation path and cause air to flow through the air circulation path, the heat exchanger exchanging thermal energy with the air flowing through the air circulation path, wherein the air circulation element is disposed in the baffle plate, and wherein the heat exchanger is spaced from the baffle plate with respect to a longitudinal direction of the enclosure.

13. A thermal control system comprising:

a thermal mass;

an enclosure containing the thermal mass, the enclosure having a circular cross-sectional shape;

a baffle plate disposed in the enclosure, the baffle plate having a curvature substantially equal to a curvature of the enclosure;

a heat exchanger disposed in the enclosure and cooperating with the baffle plate to divide the enclosure into a first chamber and a second chamber, the heat exchanger having a curvature substantially equal to the curvature of the enclosure; and an air circulation element cooperating with the baffle plate and the heat exchanger to define an air circulation path and cause air to flow through the air circulation path, the heat exchanger exchanging thermal energy with the air flowing through the air circulation path, wherein the air circulation element is disposed in the baffle plate.

14. The thermal control system of claim 13, wherein the thermal mass is one of mechanical components and electrical components prone to deterioration from the environment.

15. The thermal control system of claim 13, wherein the enclosure has a circular cross-sectional shape.

16. The thermal control system of claim 15, wherein the baffle plate and the heat exchanger have a curvature corresponding to a curvature of an inner surface of a periphery of the enclosure.

17. The thermal control system of claim 13, wherein the air circulation path extends in order through the second chamber from the air circulation element to an inlet of the heat exchanger, through the heat exchanger, and through the first chamber from an outlet of the heat exchanger to the air circulation element.

18. A thermal control system comprising:

a thermal mass;

an enclosure containing the thermal mass;

a baffle plate disposed in the enclosure;

a heat exchanger disposed in the enclosure and cooperating with the baffle plate to divide the enclosure into a first chamber and a second chamber, the heat exchanger including a plurality of arcuate concentrically aligned tubes and a plurality of fins interposed between the plurality of tubes; and an air circulation element cooperating with the baffle plate and the heat exchanger to define an air circulation path and cause air to flow through the air circulation path, the heat exchanger exchanging thermal energy with the air flowing through the air circulation path, wherein the air circulation element is disposed in the baffle plate.

* * * * *